Oct. 14, 1969 K. H. MÜLLER 3,473,138

CIRCUITRY FOR SUPPRESSION OF PARALLEL DRIFT IN D.C. DIFFERENTIAL AMPLIFIERS

Filed Jan. 12, 1967

INVENTOR
KARL HEINZ MÜLLER

BY [signature]
ATTORNEY.

United States Patent Office 3,473,138

Patented Oct. 14, 1969

3,473,138
CIRCUITRY FOR SUPPRESSION OF PARALLEL DRIFT IN D.C. DIFFERENTIAL AMPLIFIERS

Karl Heinz Muller, Neu-Isenburg, Germany, assignor to Honeywell G.m.b.H., Frankfurt am Main, Germany, a corporation of Germany Filed Jan. 12, 1967, Ser. No. 608,786
Claims priority, application Germany, Jan. 25, 1966, H 58,336
Int. Cl. H03f 3/68
U.S. Cl. 330—30 4 Claims

ABSTRACT OF THE DISCLOSURE

In a plural stage differential amplifier, the output terminals of which carry a positive and negative signal, respectively, with reference to ground, an additional differential amplifier stage is employed to compare the algebraic sum of the positive and negative components with ground. The resultant of that comparison is applied to control the operation of the plural stage differential amplifier in a common mode sense to shift the effective zero toward ground.

In D.C. differential amplifiers, the objective is to amplify the difference between two input signals without having the resultant influenced by changes which are common to both input signals, so-called common mode changes. The output of such differential amplifiers is also in the form of a potential difference across two output terminals, without respect to a reference potential. In many instances, however, it is desriable or necessary that the output signal be balanced about a fixed reference, that is that the output signal have a positive and a negative component which are equal and opposite with respect to a predetermined reference point. While previous differential amplifiers have been designed to initially provide such a balanced output, aging, temperature sensitivity, or changes in the characteristics of the elements of the amplifier from other causes results in a common mode or parallel drift of the axis of symmetry of the signal away from the desired reference point.

It is, accordingly, an object of the present invention to provide an improved differential amplifier which is capable of producing a balanced output signal with respect to a predetermined reference potential.

It is another object of this invention to provide improved differential amplifier means, as set forth, the stability of which is independent of aging, temperature sensitivity or other changes in the characteristics of the amplifier elements.

It is still another object of the present invention to provide an improved differential amplifier means as set forth which is characterized in that the stability of the balanced condition is independent of the condition of the load on the amplifier.

In accomplishing these and other objects, there is provided, in accordance with the present invention, in a plural stage differential amplifier, an auxiliary differential amplifier which provides a comparison between a point of fixed reference potential (ground) and the algebraic sum of the positive and negative components of the output signal of the plural stage differential amplifier. The resultant of that comparison controls the common mode operation of the plural stage amplifier in such a way as to maintain the symmetry of the output with respect to the predetermined reference point. When ground is selected as the reference point, the reference is not subject to any of the variations associated with thermal, aging, or other condition of the circuit elements. Therefore, a high order of stability is established for the symmetry of the output signal. Similarly, since ground potential is not affected by unbalanced conditions of the load connected to the amplifier, the condition of the load does not affect the stability of the symmetry of the output signal with respect to the reference point.

A better understanding of the present invention may be had from the following detailed description when read in connection with the accompanying drawing in which.

Figure 1:
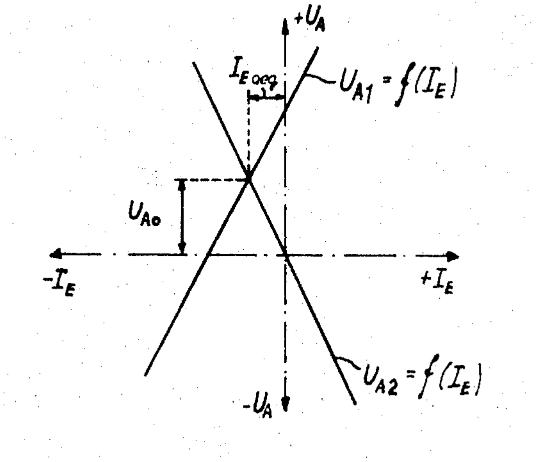
FIGURE 1 is a graph illustrating the operation characteristics of a conventional D.C. differential amplifier.

Referring now to the drawings in more detail, the graph shown in FIGURE 1, illustrates the typical characteristic curve of a symmetrical differential amplifier. There it may be seen that the output voltage, $U_{a1}$, at one of the output terminals of the differential amplifier increases as a direct function of an input current signal, while the voltage signal, $U_{a2}$, at the other output terminal of the differential amplifier decreases correspondingly as a direct function of the input current signal. In an ideal situation the intercepts of the curves $U_{a1}$ and $U_{a2}$ should coincide with the origin, or intercept, of the $U_a$–$I_e$ coordinates. Under those conditions the absolute value of $U_{a1}$ is equal to $U_{a2}$. In practice, this ideal condition does not obtain due to variations in the parameters of the circuits resulting from aging of the components, thermal drift characteristics, or variations in the circuit elements due to other causes. When this occurs, the intercept of the curves $U_{a1}$ and $U_{a2}$ lies in one of the four quadrants as shown in FIGURE 1. The horizontal displacement of the intercept is a measure of the asymmetrical drift and is represented by an effective equivalent drift of the input current $I_{eaeq}$. The vertical displacement $U_{ao}$ is a measure of the parallel or asymmetrical drift of the output voltage. While, in many instances, the asymmetry of the output voltage is not a disadvantage, there are occasions when the output voltage from the differential amplifier is applied as input signals to a subsequent device, the input circuit of which is referenced to ground, such as in integrators, digital to analog converters, and the like. In such circumstances, the asymmetry of the output signal from the differential amplifier adversely affects the operation of such subsequent devices.

Figure 2:
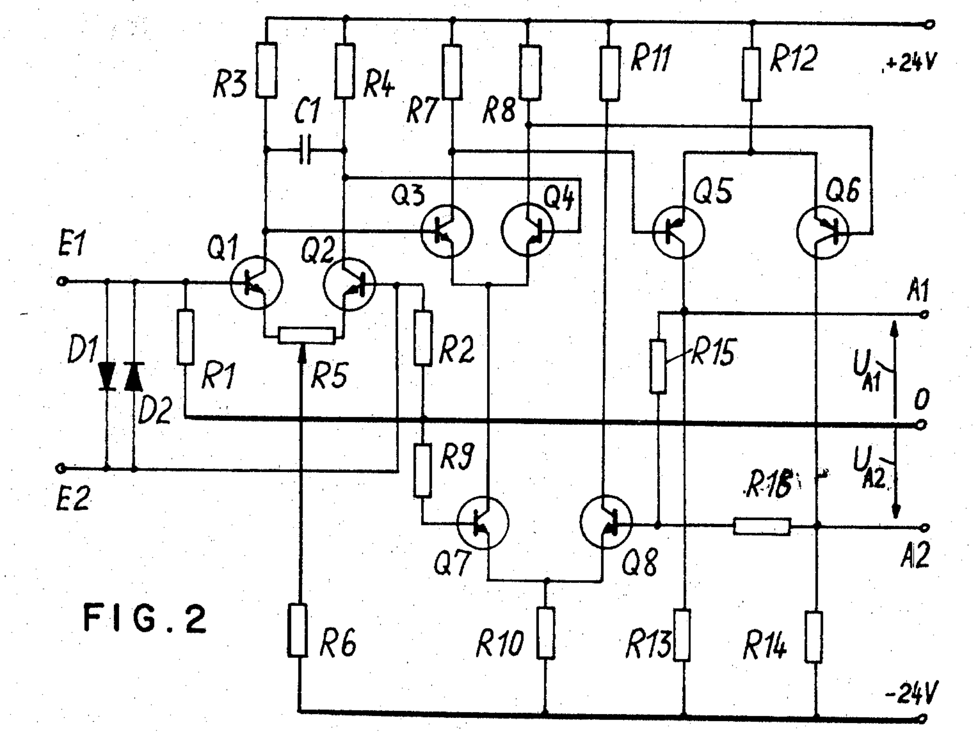
FIGURE 2 is a schematic circuit diagram of a differential amplifier embodying the present invention.

In FIGURE 2 there is shown a preferred embodiment of the present invention. The first differential amplifier stage includes a first transistor $Q_1$ and a second transistor $Q_2$. These transistors are connected in a common emitter mode. A first input terminal $E_1$ is directly connected to the base electrode of the first transistor $Q_1$, while a second input terminal $E_2$ is directly connected to the base electrode of the second transistor $Q_2$. Between the two input terminals $E_1$ and $E_2$ a pair of inversely connected, limiting diodes $D_1$ and $D_2$ are connected. These serve to suppress distortions to and by-pass excessive input voltage signals which would tend to damage the transistors. A base bias resistor $R_1$ is connected between the base of the first transistor $Q_1$ and a point of fixed reference potential, or ground. Similarly, the base electrode of the second transistor $Q_2$ is connected through a bias resistor $R_2$ to ground. The collector electrode of the transistor $Q_1$ is connected through a load resistor $R_3$ to the positive terminal of the power supply which may be, for example, at a potential of the order of +24 volts. The collector electrode of the second transistor $Q_2$ is connected to the positive terminal of the power supply through a load resistor $R_4$. A capacitor $C_1$ interconnects the collector electrodes of the first and second transistor and serves to suppress oscillations within the amplifier. The emitter of the transistor $Q_1$ is connected through a balancing slide wire resistor $R_5$ to the emitter of the transistor $Q_2$. The slider of the slide wire resistor $R_5$ is connected through a common emitter resistor $R_6$ to the negative terminal of the power supply, which may, for example, be of a potential of the order to −24 volts.

The output signal from the collector of the transistor $Q_1$ is directly connected to the base electrode of a transistor $Q_3$, while the output signal from the collector of the transistor $Q_2$ is directly connected to the base electrode of a transistor $Q_4$. The transistors $Q_3$ and $Q_4$ together comprise a second differential amplifier stage of a plural stage differential amplifier. The collector of the transistor $Q_3$ is connected through a load resistor $R_7$ to the positive terminal of the power supply. Similarly, the collector of the transistor $Q_4$ is connected through a load resistor $R_8$ to the positive terminal of the power supply. The emitters of the transistor $Q_3$ and the transisor $Q_4$ are connected together to a common junction. This common junction between the emitters of the transistors $Q_3$ and $Q_4$ is connected to the collector of a transistor $Q_7$. The base electrode of the transistor $Q_7$ is connected through a resistor $R_9$ to the reference or ground lead. The transistor $Q_7$ together with the transistor $Q_8$ comprise an auxiliary differential amplifier. The emitter of the transistor $Q_7$ is directly connected to the emitter of the transistor $Q_8$ at a common junction, which junction is connected through the common emitter resistor $R_{10}$ to the negative terminal of the power supply. The collector of the transistor $Q_8$ is connected through a load resistor $R_{11}$ to the positive terminal of the power supply.

The output of the collector of the transistor $Q_3$ is directly connected to the base of a transistor $Q_5$, while the output of the collector of the transistor $Q_4$ is directly connected to the base electrode of a transistor $Q_6$. The transistors $Q_5$ and $Q_6$ are also connected as a differential amplifier stage and comprise the output stage of the plural stage differential amplifier. Again, the emitter of the transistor $Q_5$ is directly connected to the emitter of the transistor $Q_6$ at a common junction point which, in turn, is connected through a common emitter resistor $R_{12}$ to the positive terminal of the power supply. The collector of the transistor $Q_5$ is connected through a load resistor $R_{13}$ to the negative terminal of the power supply, while the collector of the transistor $Q_6$ is connected through a load resistor $R_{14}$ to the negative terminal of the power supply. A first output terminal $A_1$ is connected to the collector of the transistor $Q_5$ and a second output terminal is connected to the collector of the transistor $Q_6$. Serially connected between the two ouput terminals $A_1$ and $A_2$ are a pair of matched, high quality resistors $R_{15}$ and $R_{16}$. The junction between the resistors $R_{15}$ and $R_{16}$ is connected to the base electrode of the transistor $Q_8$.

In operation, differential input signals are applied to the two input terminals $E_1$ and $E_2$ of the plural stage differential amplifier. These input signals are applied directly to the input electrodes, respectively, of the transistors $Q_1$ and $Q_2$ comprising the first stage of the differential amplifier. The slide wire resistor $R_5$ is adjusted to provide initial balancing or "zeroing" of the system with respect to the input signal. The outputs of the first stage of the differential amplifier is connected in cascade to the corresponding transistors of the second stage of the differential amplifier. Similarly, the outputs of the second stage of the differential amplifier is connected in cascade to the inputs of the third stage of the plural stage differential amplifier. In the illustrated embodiment the third stage is the output stage.

A characteristic of differential amplifiers of the type set forth herein is the inclusion of a common emitter impedance element, that is—the emitters of the two transistors of the differential stage are connected together and impedance means common to both emitters and constituting a common conduction path therefor is connected between the emitters and a reference potential. In conventional circuitry that common emitter impedance means is usually a resistor as illustrated in this case by $R_{10}$, the common emitter impedance of the auxiliary differential amplifier stage including transistor $Q_7$ and $Q_8$. With such an arrangement, an input signal which changes the conductivity characteristic of one of the transistors comprising the differential amplifier stage results in a change in voltage across the common emitter impedance, thereby resulting in a inverse change in the conductivity characteristics of the other transistor of the differential amplifier pair. In accordance with the present invention, the common emitter impedance of the second differential amplifier stage of the plural stage differential amplifier includes a dynamic impedance element represented by the transistor $Q_7$ and the resistor $R_{10}$. However, the transistor $Q_7$ and the resistor $R_{10}$ are part of the auxiliary differential amplifier which also includes transistor $Q_8$. Since the base or control electrode of the transistor $Q_7$ is clamped to the reference potential or ground, its conductivity characteristic is controlled by the bias developed across the common emitter resistor $R_{10}$. The other half of the auxiliary differential amplifier, i.e. transistor $Q_8$, has its control or base electrode connected to the junction between resistors $R_{15}$ and $R_{16}$. Since the resistors $R_{15}$ and $R_{16}$ are matched the junction point between these two resistors should be at a potential which is the algebraic sum or median of the potentials on output terminals $A_1$ and $A_2$. If the output signals are symmetrical with respect to the reference potential, or ground, the algebraic sum or median of the potentials on the output terminals $A_1$ and $A_2$ will be equal to the reference potential, or ground. Under these conditions, identical control signals will be applied to the base electrodes of the transistor $Q_7$ and $Q_8$, respectively.

With respect to the differential input signal supplied to the input terminals $E_1$ and $E_2$, the dynamic impedance of the auxiliary differential amplifier stage has no deleterious effect. That is, the amplification of the differential signal is not affected, in a differential sense, by the operation of the auxiliary differential amplifier.

Let it be assumed, however, that, due to aging, thermal effects, or the like, the three stage differential amplifier output drifts in a direction such that the outputs signal in no longer symmetrical with respect to the reference, or ground, potential. Under those conditions, the algebraic sum or median of the output signals appearing at the output terminals $A_1$ and $A_2$ will not be equal to the reference, or ground potential. Accordingly, the control signal applied to the base electrode of the transistor $Q_8$ will not be equal to the reference potential applied to the base electrode of the transistor $Q_7$. If, for example, the drift where such that the median of the two output potentials increased with respect to the reference potential i.e. changed in a positive direction, this would cause an increase in the conductivity of the transistor $Q_8$. The increase in the conductivity of the transistor $Q_8$ would cause a corresponding increase in the potential drop across the resistor $R_{10}$. This, in turn, would cause a decrease in the conductivity through the transistor $Q_7$ which correspondingly would cause a simultaneous decrease in the current flow through the transistors $Q_3$ and $Q_4$. The decrease in current flow through the transistor $Q_3$ and $Q_4$ would be accompanied by an elevation of the potential of the output leads thereof. Since the transistors $Q_5$ and $Q_6$ are of opposite conductivity type with respect to the transistor $Q_3$ and $Q_4$, the application of the increase potential from the output of the transistors $Q_3$ and $Q_4$ respectively to the base electrodes of the transistors $Q_5$ and $Q_6$ would cause a corresponding simultaneous decrease in the current flow through the transistors $Q_5$ and $Q_6$. The decrease in current flow through the transistors $Q_5$ and $Q_6$ would simultaneously reduce the potential of the signals appearing at the output electrodes $A_1$ and $A_2$. This change in the potential of the signals appearing at the output electrodes $A_1$ and $A_2$ will be in a direction and of an amount to correct for the unwanted asymmetry. Since the controlling action of the auxiliary differential amplifier is applied simultaneously to both halves of the differential amplifier stages of the main differential amplifier, this control action does not adversely affect the operation of the main amplifier, in the differential sense. It will be appreciated, of course, that if the drift had resulted in the asymmetry being in a negative direction, the control action would have been the same as hereinbefore set forth but in opposite sense at each step of the operation.

Thus it may be seen that there has been provided in accordance with the present invention an improved differential amplifier which is capable of producing a balanced output signal with respect to a predetermined reference potential, the stability of which is independent of aging, temperature sensitivity or other changes in the characteristic of the amplifier components or of the balance condition of the load on the amplifier.

The embodiments of the invention in which an exclusive property or privilege is claimed are defined as follows:

1. In a differential amplifier having an output signal which is symmetrical with respect to a reference potential, means for suppressing common-mode drift in said amplifier which would tend to produce a symmetry of said output signal with respect to said reference potential, said means comprising means for deriving a median signal from said output signal, comparison means for comparing said median signal with said reference potential and producing an error signal proportional to the resultant of said comparison, and means responsive to said error signal from said comparison means for controlling the common-mode conductivity characteristic of said differential amplifier in a direction opposed to said common-mode drift whereby to maintain said symmetrical relationship of said output signal with respect to said reference potential, said means for deriving said median signal comprising a pair of matched resistors serially connected between a pair of output terminals of said differential amplifier, said median signal being derived at the junction between said resistors, said comparison means comprising an auxiliary differential amplifier including a first and a second transistor and having a first and second input means, said first input means being connected to a point of reference potential and said second input means being connected to receive said median signal, said first transistor being connected with its conductivity path connected in series in a common conduction path of said first mentioned differential amplifier.

4. The invention as set forth in claim 2 wherein said transistors of said auxiliary differential amplifier are connected in common-emitter configuration, the base electrode of said first transistor being connected to said point of reference potential and said base of said second transistor being connected to said junction between said matched resistors.

3. The invention as set forth in claim 2 wherein said point of reference potential is ground.

4. The invention as set forth in claim 2 wherein said first mentioned differential amplifier comprises a transistor amplifier having at least three stages and wherein said first transistor of said auxiliary amplifier is connected in the common conduction path of the second of said three stages.

References Cited

FOREIGN PATENTS 1,202,835 10/1965 Germany.

ROY LAKE, Primary Examiner

LAWRENCE J. DAHL, Assistant Examiner